United States Patent [19]
Newton et al.

[11] Patent Number: 5,878,375
[45] Date of Patent: Mar. 2, 1999

[54] DATA TRANSFER SWITCHING DEVICE AND METHOD OF USE THEREFORE

[76] Inventors: Timothy T. Newton; Eric A. Lee, both of 1351 Heidi Cir., Anchorage, Ak. 99518

[21] Appl. No.: 324,758

[22] Filed: Oct. 17, 1994

[51] Int. Cl.⁶ .................................................. G06F 13/00
[52] U.S. Cl. ...................... 702/58; 702/60; 364/528.27; 361/80; 361/81; 307/112; 307/126
[58] Field of Search ................... 364/480, 486, 364/483, 492, 528.21, 528.27, 528.28, 528.29; 324/103 P, 103 R, 418; 340/644, 826, 827, 825.15, 16.18; 361/63–66, 68, 71, 79, 80, 81, 83, 84, 87–91, 93–97; 395/183.06, 12, 488, 858, 311; 307/112, 115, 116, 126, 132 E, 134, 137, 139, 140; 341/126, 155; 702/57–60, 64, 65, 80, 85, 106, 107, 119, 123, 126, 182, 183, 185, 187, 189, 190, 61

[56] References Cited

U.S. PATENT DOCUMENTS

| | | |
|---|---|---|
| 4,507,700 | 3/1985 | Andow et al. .............................. 361/80 |
| 4,608,648 | 8/1986 | Oogaki ...................................... 364/483 |
| 5,224,011 | 6/1993 | Yalla et al. ................................ 361/80 |
| 5,428,553 | 6/1995 | Chiba et al. ............................. 364/492 |

*Primary Examiner*—Hal Dodge Wachsman
*Attorney, Agent, or Firm*—Fish & Richardson PC

[57] ABSTRACT

A data switch for transferring data from either actual line readings or from stored memory to the input of a relay tester. The device uses a digital switch set between the A/D converter and the CPU of an electronic relay. The switch permits technicians and engineers to either pass data to the CPU from the system through the A/D converter or, by switching, feed the CPU data from the RAM, which has been loaded with the archived data. In this way, the relay system software can be examined and tested using actual event data under ordinary conditions as desired, with relay settings changed between tests to verify the efficacy of the changed settings to perform as desired for the recorded conditions. The digital switch can be either a hard-wired element, or can be a soft switch, operated through software instructions.

8 Claims, 2 Drawing Sheets

DATA TRANSFER SWITCHING DEVICE AND METHOD OF USE THEREFORE

This invention relates to testing of electric power protective relays and more particularly to testing methods utilizing prior event information to examine relay performance.

BACKGROUND OF THE INVENTION

Electrical power systems have relied on a system of protective relays to monitor and protect the expensive equipment used in electrical power transmission systems. Such systems have lines, transformers, busses, and feeders that supply power to the entire nation. Electrical faults caused by short circuits, lightning strikes or equipment failures cause disturbances on these systems. Protective equipment such as circuit breakers, line switches, capacitors and reactors operate automatically to cut off faults or to provide system stability as needed. To operate and monitor this equipment, a system of protective relays has been developed. These relays monitor current, voltage, frequency and other operating parameters and cause the protective devices to operate if a fault is detected. In the past, relays were electromechanical devices that had current and voltage detectors. Operation was mechanical: a rotating disk was energized by an overcurrent, for example. The disk then turned until a contact was made, causing the relay to trip, sending an alarm signal or a signal to operate a circuit breaker, for example. Relays were set to operate at the appropriate current level and in a specific amount of time. Today, many relays are electronic, they have programmable central processing units (CPU), volatile read write memory, typically referred to as "random access memory" (RAM), and input-output (I/O) circuits.

All relays must be set and tested before use. Testing of electronic relays follows the same basic course as was used for the mechanical designs. To test any relay, a test voltage or current is applied to the input circuits of the relay and its performance is monitored. For an overcurrent relay, for example, the current sent to the relay is gradually increased until the trip level is reached. Then, the time it takes for the relay to trip is monitored or set for the particular relay. For mechanical models, setting may take some time as it requires physical adjustments of the mechanism. In electronic relays, the settings can be programmed exactly and then tested using the test procedure described above.

To perform the tests, technicians or engineers use a test set that is connected to the relay circuits in the field. In this way, the circuitry of the system can be tested as well as the relay itself. An example of such a relay test set can be found in U.S. Pat. No. 4,177,419 to Fioentzis.

One of the features of the new digital electronic relays is that they are able to capture and record real-time event data. For example for any type of fault, the relay can record the voltages, currents phase angles, frequencies and other parameters as the event is unfolding. This data is useful in determining what caused the fault and whether the protection system operated properly during the event. In the past, this data was recorded on oscillographs, which produce a paper record of the event that could only be used for visual analysis. The storage systems available today store data in a portable computer readable form. Some relay test sets available today can read this stored data and then reproduce the stored waveforms in analog form. Although this is a marked improvement, using today's equipment to replay a stored event requires a test set that is capable of receiving the stored data and then converting it into the analog signals that the data represent in order to reproduce the archived event at the relay inputs. Since such test sets have high capital and operating costs, it is not always practical to test relays using stored event data.

SUMMARY OF THE INVENTION

As mentioned above, to replay an event through an electronic protective relay one must have a test set that is capable of receiving stored data and then converting it into the analog signals that the data represent. This is so because the relays have analog input circuits that require voltage and current data from electric power system facilities in analog form. This data is then fed through an analog-to-digital (A/D) converter and then fed into the relay's CPU. Here, the data is acted on by the relay's software. If the data show an abnormal event, the software sends appropriate output signals to open a circuit breaker sound an alarm, etc. The input data is then stored in the relay's RAM, where it can be removed through a user interface and kept in long term storage.

Even if the necessary test equipment is available, it may not always be capable of exactly checking relay performance. For example, if a relay fails in some way to operate properly during an event, there is little that can be done to test the software using inputs that exactly replicate the event. This is because the stored event must be converted back to analog signals, usually in a test set, and then fed back through the relay's A/D converter. This double conversion can cause distortion, which can affect the signals and hence, the validity of the test.

The present invention modifies the normal data access instruction set within the relay's software to enable the relay software to be tested by replaying actual recorded event data directly. The instant invention first adds a data path from the external archive system (typically a hard disk) to the RAM on the relay. A second data path from the RAM to a new software-based data "switch" set between the A/D converter and the CPU is also installed. Although one could hard wire the necessary data paths and install the switch, in practice, this "switch" is actually a software pointer that either selects input from the A/D converter or takes the archived data out of the RAM. Using the switch permits technicians and engineers to either pass data to the CPU from the real-time system through the A/D converter or, by switching, feed the CPU data from the RAM that has been loaded with the archived data.

In this way, the relay software can be examined and tested using actual event data under ordinary conditions (unlike the stressful conditions experienced during the actual event). The relay can be tested as many times as desired. Moreover, settings can be modified and tested to ensure proper coordination and operation.

It is an object of this invention to produce a device that can test operation of an electronic relay using archived data without the use of a conventional physical test set, while replicating actual event input conditions.

It is another object of this invention to produce a method of testing electronic protective relays by using archived data without the use of a test set.

DISCUSSION OF THE PRIOR ART

Figure 1:
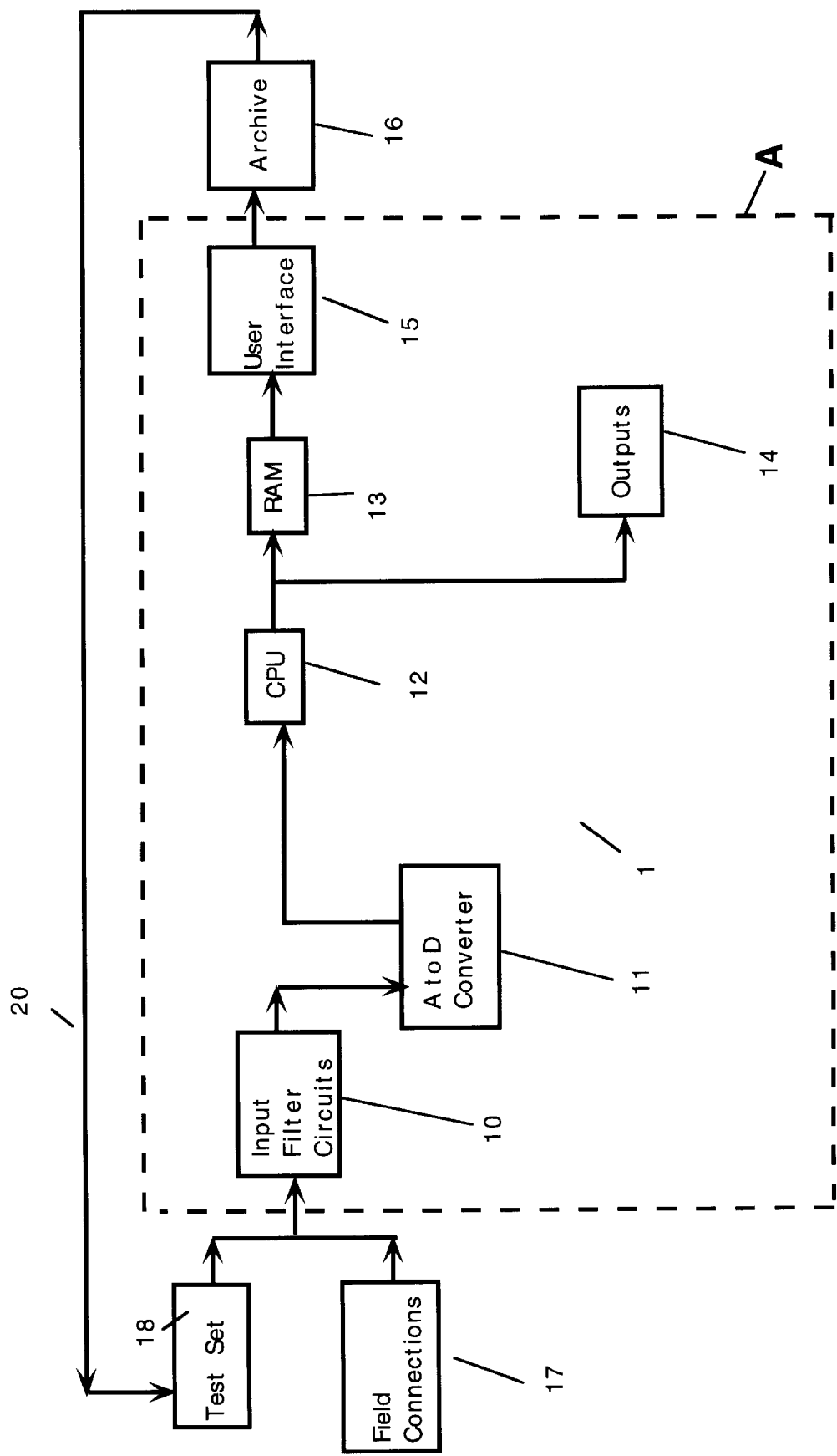
FIG. 1 is a block diagram showing the prior art relay functional groupings and data paths.

FIG. 1, is a block diagram of a typical conventional microprocessor-based protective relay 1. The relay components are shown within the dotted space showing a functional group A. This group concept will be discussed in greater detail below. A typical protective relay system has relay components including: input filtering circuitry 10, an A/D converter 11, a central processing unit (CPU) 12, a volatile read-write memory, often call a RAM 13. and an output interface 14, which is used to send signals to activate equipment such as circuit breakers or panel alarms. Relay system components that are not integral to the relay include a user interface 15 and an archive unit 16 (typically a hard disk or tape system) that can be attached to the user interface 15.

The relay receives input data from a set of field connections 17. These connections vary depending on the type of relay in use. For example, overcurrent relays typically receive phase currents. Frequency relays typically monitor system frequency through voltage inputs. The field connections 17 are designed to receive input from a relay test set 18. This test set 18 is used to provide input current, voltages and frequencies in magnitudes sufficient to cause the relay to operate. In this way, the relay can be tested and calibrated. Depending on the user interface, actual fault events—a real time capture of voltages, currents, phase angles and frequency—can be collected and stored in the archive 16. Presently, because no data path is provided directly from the archive 16, the only way in which an event can be replayed to observe relay operation, is through a test set. This is shown on FIG. 1 through data path 20. The test set 18 can be used to input the archived signals back through the A/D converter 11 and the CPU 12. In this way, near-actual relay performance for the event can be observed. The problem with this system is that it requires an expensive test set. The test set not only has a high capital cost, but a high operating costs (storage, transportation, set-up and personnel) as well. This makes replaying of events by conventional means costly. Moreover, because the archived data must be converted from digital to analog format and then back to digital format, distortions of the signals occur. This may affect the accuracy of the converted signals, possibly compromising the test.

DETAILED DESCRIPTION OF THE INVENTION

Figure 2:
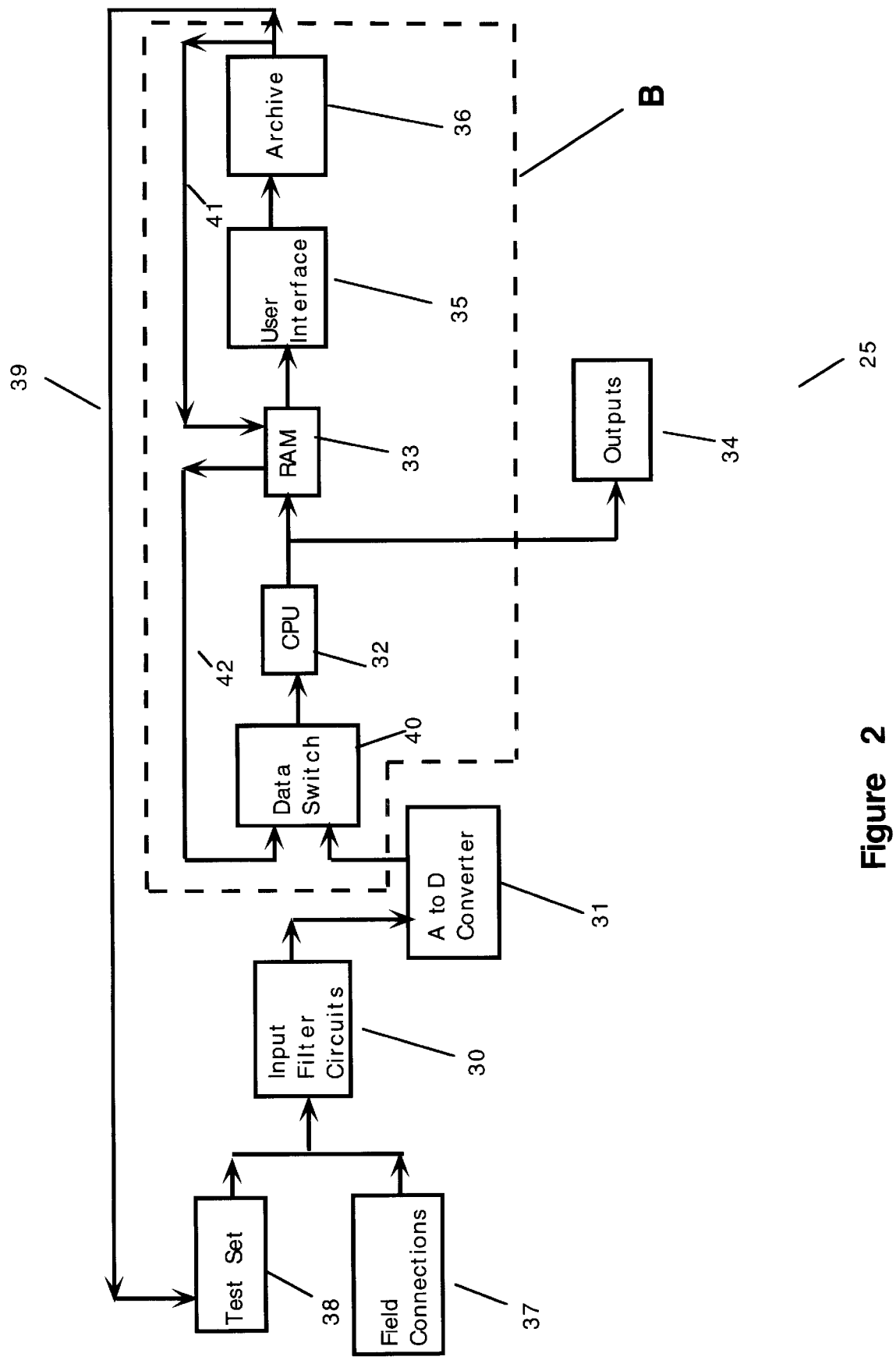
FIG. 2 is a block diagram showing the instant invention's testing functional groupings and data paths.

Referring now to FIG. 2, the present invention is shown. This design uses the basic components within the relay system as before, but adds two new data paths and a data switch. For convenience, the components have been renumbered to prevent confusion and to differentiate the two systems. The components found in the instant invention, as a relay system, are: a microprocessor-based protective relay 25 and associated components. The microprocessor-based protective relay 25 has input filtering circuitry 30, an A/D converter 31, a CPU 32, a RAM 33, and an output interface 34. The associated system components include: a user interface 35 and an archive 36.

The relay 25 receives input data from a set of field connections 37 as in the case of existing relays. The field connection interface also is designed to receive input from a relay test set 38. A data path 39 feeds from the archive 36 to the test set 38 as before.

To these basic components, a data switch 40 is placed between the output of the A/D converter 31 and the CPU 32. A new data path 41 is installed between the archive 36 and the RAM 33. A second new data path 42 is installed between the RAM 33 and the data switch 40.

The preferred method of establishing the data paths 41, and 42 and the data switch 40 uses software instructions. For example, in existing relay software instruction sets, after initializing steps, a code instruction to read A/D converter 31, causes the CPU 32 to read data coming from the A/D converter 31. The part of an instruction set for a conventional digital relay that calls for reading data from the A/D converter might look like this:

```
               •
IN THE UNITED STATES PATENT AND TRADEMARK OFFICE
               •
               •
         initialization
               •
               •
           (read A/D)
               •
               •
        process A/D values
               •
               •
The instant invention uses code instructions similar to these:
               •
               •
         initialization
               •
               •
         if(replay mode)
       then(dump data to RAM)
          and[read RAM]
             else
         if(normal mode)
         then (read A/D)
               •
               •
        process A/D values
               •
               •
```

Note a software driven switch is preferred because it is fast and versatile. It is possible to hard wire the data paths and switch into the relay circuitry. This reduces the versatility of the device because once installed, the data paths and switch are not easily changed.

Moreover, it is possible to read the data directly from the archive 36, bypassing the movement from archive 36 to RAM 33. However, this is not preferred because it is a slower process.

These new paths and switch permit test personnel to download an archived event into the relay's RAM 33, where it can then be fed through the switch directly into the CPU 32. This permits the CPU 32 to read the archived data effectively as if it came from the A/D converter 31. Thus, the CPU 32 can now receive either real-time inputs through the A/D converter 31 or receive stored data from the archive 36. In either case, the CPU 32 executes relay functions according to the input perceived. The CPU 32 reacts to the stored data as if it were data coming directly from the A/D converter 31. This permits thorough testing of the relay software using recorded data. This method does not test the input filters 30 or A/D converter 31, however.

As mentioned above, the existing procedure for testing operations of relays using inputs replicating past events requires use of a test set 38 that receives data from the archive 36. Such a test set must be capable of receiving and interpreting this data and then converting this data into replicated analog waveforms that can be then fed into the filters 30 and A/D converter 31. The new method bypasses the test set and dumps digital data into the CPU 32 directly. This saves the considerable cost of the test set and considerable operating costs as well as improving signal quality because the archived data need not be converted to analog and then back to digital signals with the possibility of errors in the data conversion process.

This new system and method can change the concept of protective relay testing. For example FIG. 1 shows a typical digital electronic relay. A dashed line A delineates the major relay components into a functional group. FIG. 2 shows a different set of relay and non-relay components surround by a dashed line labeled as functional group B. Functional group B employs the system of the instant invention. Adopting the configuration of function group B eliminates the test set as a necessity. Moreover, all of the components shown in group B can be assembled into a single device. This can be either a protective relay that has the user interface and the archive built in, or it can be housed as software in a personal computer, which can then be used to simulate the real-time functionality of a relay.

Thus, engineers or technicians wanting to test or design protective relays using real time data can use a personal computer programmed with the group B software without having to have the relay hardware or test sets. This makes design and testing of relay software faster, easier, less expensive and more reliable.

The switching capability and new data links, in the preferred embodiment are software driven. In other words, the user can choose from a software menu to either have the CPU 32 respond to inputs from the A/D converter 31 in real time, or by selecting another option, cause data stored in archives 36 to be placed in the relay's RAM 33 and then have the CPU 32 look to the RAM 33 for input data to the relay, thereby extracting the archived data directly. In this way, the expense and inconvenience of test sets and actual relay components is eliminated.

The present disclosure should not be construed in any limited sense other than that limited by the scope of the claims having regard to the teachings herein and the prior art being apparent with the preferred form of the invention disclosed herein and which reveals details of structure of a preferred form necessary for a better understanding of the invention and may be subject to change by skilled persons within the scope of the invention without departing from the concept thereof.

We claim:

1. A device for use with a protective relay system, the relay system having an analog-to digital converter connected to receive inputs from an electric power system, a central processing unit configured to receive an output of the analog-to-digital converter, a volatile read-write memory, a user interface, and an archive unit, the device comprising:

a) a first data path, installed between the archive unit and the volatile read-write memory;

b) a data switch having a first input, a second input, and one output, the data switch connected between the output of the analog-to-digital converter and the central processing unit, with the output of the converter connected to the first input, and the output of the data switch connected to the central processing unit; and c) a second data path, installed between the volatile read-write memory and the second input of the data switch, such that a user may select, via the user interface, to send output from the analog-to-digital converter to the central processing unit, or to send data stored in the volatile read-write memory to the central processing unit.

2. The device of claim 1 wherein the first data path, the data switch, and the second data path comprise physical connections within said protective relay system.

3. The device of claim 1 wherein the first data path, the data switch, and the second data path are created through a set of software instructions.

4. A method for use with a protective relay system, the system having an analog-to-digital converter connected to receive an input data stream from an electric power system, a central processing unit configured to receive an output of the converter, a volatile read-write memory, a user interface, an archive unit, a data switch connected between the output of the analog-to-digital converter and the central processing unit, and a data path between the archive unit and the data switch, the method comprising the steps of:

a) extracting a data set of a recorded event from the archive unit;

b) feeding the extracted data set to the data switch in said protective relay system;

c) choosing to extract the data set from the archive unit by switching the input data stream from the A/D converter to the volatile read-write memory;

d) passing the extracted data set through the central processing unit; and e) monitoring the performance of said protective relay system.

5. The method of claim 4 wherein the data path is routed to the volatile read-write memory, and a second data path is installed between the volatile read-write memory and the data switch, the method comprising the steps of:

a) extracting a data set of a recorded event from the archive unit;

b) feeding the extracted data set to the volatile read-write memory in said relay system;

c) choosing to extract the data set in the volatile read-write memory by switching the input data stream from the A/D converter to the volatile read-write memory;

d) passing the extracted data set through the central processing unit; and e) monitoring the performance of said protective relay system.

6. A protective relay system having an analog-to digital converter connected to receive inputs from an electric power system, a central processing unit configured to receive an output of the converter, a volatile read-write memory, a user interface, and an archive unit, the system further comprising:

a) a first data path, installed between the archive unit and the volatile read-write memory;

b) a data switch, having a first input, a second input, and one output, the data switch connected between the output of the analog-to-digital converter and the central processing unit, whereby the output of the analog to digital converter is connected to the first input, and the output of the data switch is connected to the central processing unit; and c) a second data path, installed between the volatile read-write memory and the second input of the data switch, such that a user may select to send output from the analog-to-digital converter to the central processing unit, or can select to send data stored in the volatile read-write memory to the central processing unit.

7. The protective relay system of claim 6 wherein the first data path, the data switch, and the second data path comprise physical connections within the protective relay system.

8. The protective relay system of claim 6 wherein the first data path, the data switch, and the second data path are created through a set of software instructions.

* * * * *

UNITED STATES PATENT AND TRADEMARK OFFICE
CERTIFICATE OF CORRECTION

PATENT NO. : 5,878,375
DATED : March 2, 1999
INVENTOR(S) : Timothy T. Newton, Eric A. Lee It is certified that error appears in the above-identified patent and that said Letters Patent is hereby corrected as shown below:

Column 4, line 8, delete the bar line;

line 9, delete "IN THE UNITED STATES PATENT AND TRADEMARK OFFICE"; and line 34, delete the bar line.

Signed and Sealed this

Thirteenth Day of July, 1999

Attest:

Q. TODD DICKINSON

*Attesting Officer*     Acting Commissioner of Patents and Trademarks